United States Patent [19]

Smolley

[11] Patent Number: 5,019,945
[45] Date of Patent: * May 28, 1991

[54] BACKPLANE INTERCONNECTION SYSTEM

[75] Inventor: Robert Smolley, Porteuguese Bend, Calif.

[73] Assignee: TRW Inc., Redondo Beach, Calif.

[*] Notice: The portion of the term of this patent subsequent to Aug. 4, 2003 has been disclaimed.

[21] Appl. No.: 384,533

[22] Filed: Jul. 25, 1989

Related U.S. Application Data

[63] Continuation-in-part of Ser. No. 835,818, Mar. 8, 1986, which is a continuation-in-part of Ser. No. 499,137, May 31, 1983, abandoned, and a continuation-in-part of Ser. No. 499,136, May 31, 1983, Pat. No. 4,574,331.

[51] Int. Cl.$^5$ .................................................. H05K 1/11
[52] U.S. Cl. ........................................ 361/412; 361/393; 361/413
[58] Field of Search ........................ 361/412, 413, 414

[56] References Cited

U.S. PATENT DOCUMENTS

| | | | |
|---|---|---|---|
| 4,288,838 | 9/1981 | Van Der Vegte et al. | 361/429 |
| 4,574,331 | 3/1986 | Smolley | 361/393 |
| 4,581,679 | 4/1986 | Smolley | 361/395 |

Primary Examiner—Gregory D. Thompson
Attorney, Agent, or Firm—James M. Steinberger; Ronald L. Taylor

[57] ABSTRACT

A backplane interconnection system for interconnecting an array of electronic components, such as integrated-circuit (IC) chip packages mounted on multilayer printed circuit boards. The backplane interconnection system includes an interface board and one or more interconnecting circuit board and a plurality of insulating boards arranged on a heat sink. The interconnecting circuit boards and the insulating boards are alternately interposed between the interface board and the array of electronic components such that an insulating board is positioned adjacent both the interface board and adjacent the array of electronic components. Connector elements disposed in selected openings of the insulating boards make electrical connections between contact areas on the interconnecting boards, the electronic components and the interface board. Any modification to an electronic component, such as a change in the input-/output configuration of an IC chip package and its circuit board, can be readily accommodated by rearranging the connector elements in the insulating boards and/or replacing one or more of the interconnecting circuit boards.

19 Claims, 3 Drawing Sheets

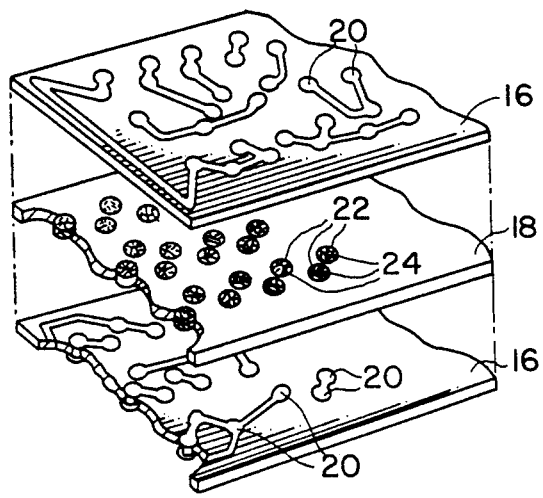
FIG. 3
FIG. 5
FIG. 4
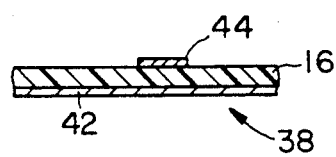
FIG. 6A
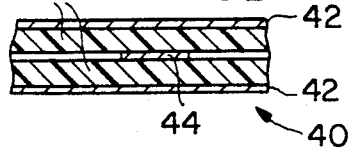
FIG. 6B
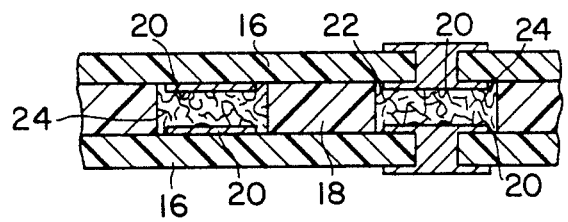
FIG. 7
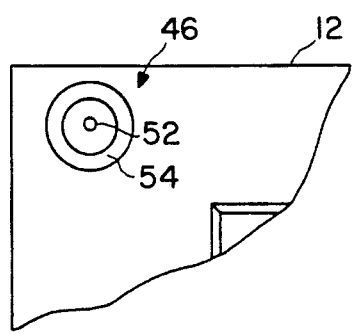
FIG. 8

BACKPLANE INTERCONNECTION SYSTEM

This application is a continuation-in-part of an application by the same inventor entitled "Integrated-Circuit Chip Interconnection System," having a filing date of Mar. 8, 1986 and Ser. No. 835,818. The '818 application is in turn a continuation-in-part of two other applications by the same inventor entitled "Button Board Chip Interconnection System," having a filing date of May 31, 1983 and Ser. No. 499,137, and "Multi-Element Circuit Construction," having a filing date of May 31, 1983 and Ser. No. 499,136. The '137 application was subsequently abandoned in favor of the '818 application and the '136 application issued as U.S. Pat. No. 4,574,331 on Mar. 3, 1986 and U.S. Pat. No. 4,581,679 on Apr. 8, 1986. The present application is also related to an earlier-filed application by the same inventor entitled "Multilayer Circuit Board Interconnection," having a filing date of Aug. 25, 1965 and Ser. No. 482,372, and subsequently abandoned.

BACKGROUND OF THE INVENTION

This invention relates generally to techniques for interconnecting electronic components and, more particularly, to backplane wiring for large electronic systems and subsystems, such as computers and the like.

Large electronic systems and subsystems are generally assembled from many smaller electronic components, such as integrated-circuit (IC) chip packages mounted on multilayer printed circuit boards. This modular construction greatly simplifies the manufacture, installation and maintenance of these systems. The IC chip packages and multilayer printed circuit boards are typically interconnected with each other by some type of backplane wiring. One conventional type of backplane wiring that is frequently used is a large circuit board having edge card connectors into which the multilayer printed circuit boards are plugged. This type of backplane wiring is generally referred to as a "mother" board. Another conventional type of backplane wiring that is frequently used relies on these same edge card connectors, but instead of a "mother board," the edge card connectors are interconnected with each other by cable harnesses.

Although these conventional types of backplane wiring have certain advantages, they also have several disadvantages. One disadvantage is that the insulated metal wires and coaxial cables used in the cable harnesses contribute a large amount of capacitance and inductance to the system, thus limiting the high speed operation of the system. Moreover, cable harnesses and their connectors can add as much as twenty-five percent to the weight and volume of the system and can also add considerably to the cost.

Another disadvantage of these conventional types of backplane wiring is that they rely heavily on soldered connections. As a result, simple modifications to the system, such as a change in the input/output configuration of a circuit board, will generally require new backplane wiring or at least major rework of the backplane wiring. This is usually very expensive and time consuming and, in many cases, the rework must be done by the manufacturer of the backplane wiring.

Accordingly, there has been a need for an improved type of backplane wiring that eliminates or at least minimizes the disadvantages of these conventional types of backplane wiring. The present invention is directed to this end.

SUMMARY OF THE INVENTION

The present invention resides in a backplane interconnection system for interconnecting an array of electronic components, such as integrated-circuit (IC) chip packages mounted on multilayer printed circuit boards. The backplane interconnection system includes an interface board and one or more interconnecting circuit boards and a plurality of insulating boards arranged on a heat sink. The interconnecting circuit boards and the insulating boards are alternately interposed between the interface board and the array of electronic components such that an insulating board is positioned adjacent the interface board and adjacent the array of electronic components. Connector elements disposed in selected openings of the insulating boards make electrical connections between contact areas on the interconnecting boards, the electronic components and the interface board. Any modification to an electronic component, such as a change in the input/output configuration of an IC chip package and its circuit board, can be readily accommodated by rearranging the connector elements in the insulating boards and/or replacing one or more of the interconnecting circuit boards.

The connector elements are each preferably formed from a single strand of metal wire, each strand being wadded together to form a nearly cylindrical "button" of material having a density of between twenty and fifty percent. Each wadded-wire connector element protrudes slightly above and below the insulating board makes electrical contact at multiple points when compressed against a contact area. In addition, each contact made by the wadded-wire connector element is at very high pressure, because of the type of spring formed by the wadded wire and the small area of each contact point.

Connectors of this type have significant advantages over the soldered or wire-wrapped connections used in conventional types of backplane wiring, and provide connections of high integrity and reliability. In contrast to a soldered connection, this mechanical connector element has very few associated variables that can affect the quality of the connection. The only significant variables are the size of the element and the compressive force used to make the connection, both of which can be accurately controlled. Furthermore, the compression of the wadded-wire connector elements is substantially elastic so that, when the compressive force is removed, the wadded-wire connector elements return to their original shape. This allows the interconnecting circuit boards in the backplane interconnection system to be replaced to easily accommodate any change in the configuration of an electronic component.

It will be appreciated from the foregoing that the present invention represents a significant advance in the area of backplane wiring. In particular, the present invention minimizes the lead lengths between interconnected electronic components and eliminates the use of conventional cable harnesses and soldered connections. The result is a high speed backplane that can be readily reconfigured for any modification to an electronic component. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIGS. 3 and 4 illustrate the interconnection of two circuit boards using the technique of the present invention;

FIG. 5 is a side elevational view of an array of electronic components showing edge contact areas;

FIGS. 6A and 6B illustrate microstrip and strip transmission lines formed in still another preferred embodiment of the backplane interconnection system of the present invention;

FIG. 7 illustrates a coaxial contact area formed on the surface of an electronic component;

FIG. 8 illustrates a coaxial-shaped configuration of connector elements and contact areas for interconnecting the coaxial-shaped contact areas on the electronic components with the strip and microstrip transmission lines in the backplane interconnection system of the present invention;

DETAILED DESCRIPTION OF THE PREFERRED EMBODIMENTS

Figure 1:
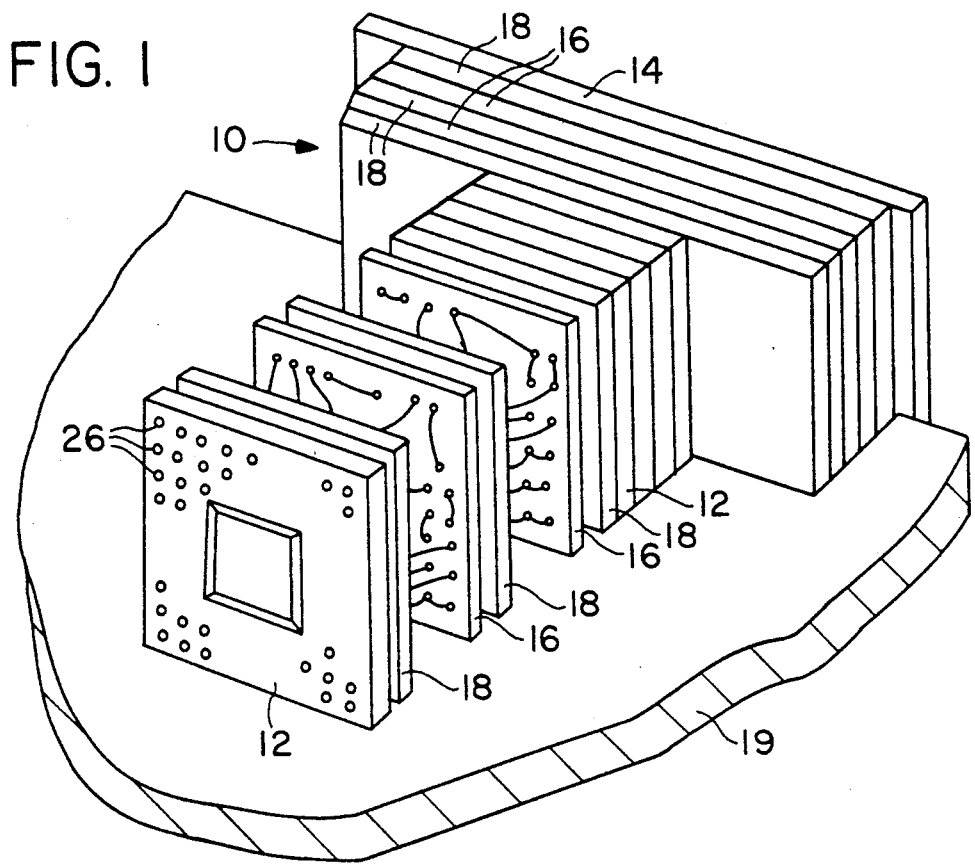
FIG. 1 is a fragmentary perspective view of a preferred embodiment of the backplane interconnection system of the present invention.

As shown in the drawings for purposes of illustration, the present invention is embodied in a backplane interconnection system for interconnecting an array of electronic components. Large electronic systems and subsystems are generally assembled from many smaller electronic components, such as integrated-circuit (IC) chip packages mounted on multilayer printed circuit boards. This modular construction greatly simplifies the manufacture, installation and maintenance of these systems. The IC chip packages and circuit boards are typically interconnected with each other by some type of backplane wiring. Several conventional types of backplane wiring are frequently used, but they have several disadvantages, including high capacitance and inductance and a heavy reliance on soldered connections.

In accordance with the present invention, interconnecting circuit boards and insulating boards are alternately interposed between an array of electronic components and an interface board. Connector elements disposed in selected openings of the insulating boards make electrical connections between contact areas on the interconnecting boards, the electronic components and the interface board. Any modification to an electronic component, such as a change in the input/output configuration of an IC chip package and its circuit board, can be readily accommodated by rearranging the connector elements in the insulating boards and/or replacing one or more of the interconnecting circuit boards.

Figure 2:
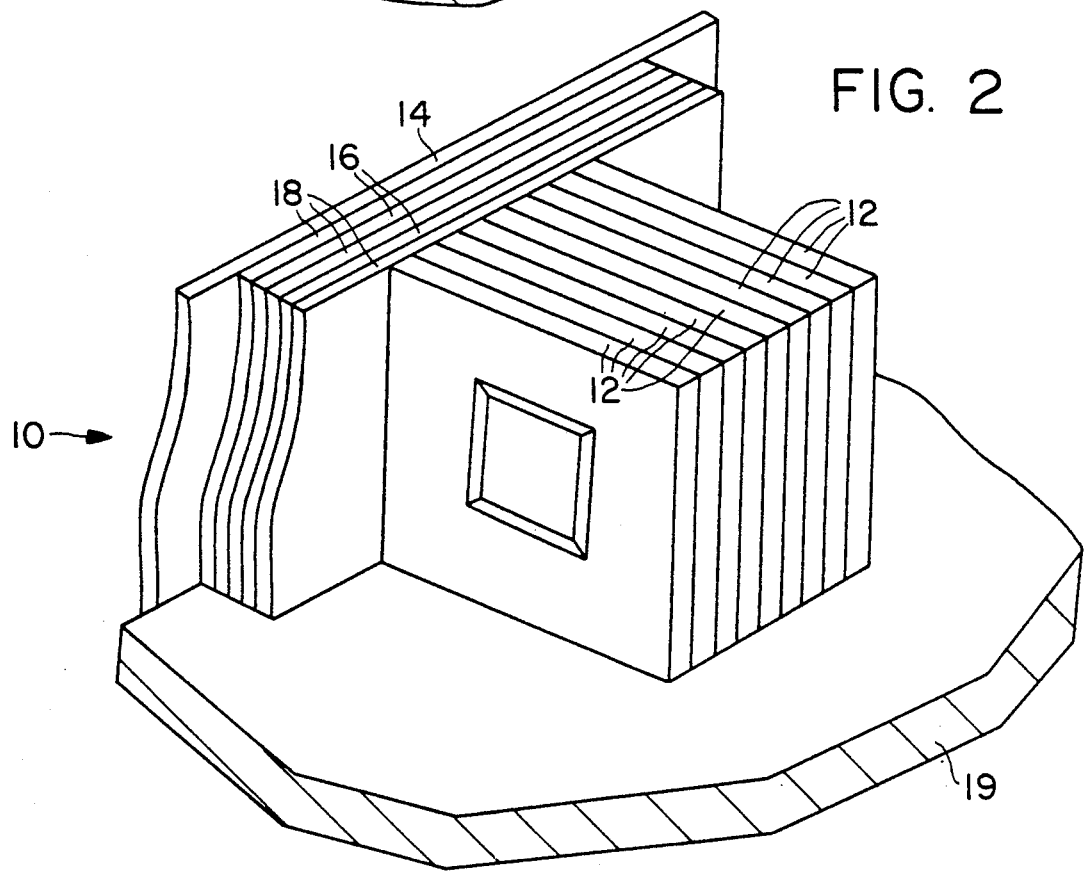
FIG. 2 is a fragmentary perspective view of another preferred embodiment of the backplane interconnection system of the present invention.

FIGS. 1 and 2 illustrate two presently preferred embodiments of a backplane interconnection system 10 in accordance with the present invention. The backplane interconnection system 10, which interconnects an array of electronic components 12, includes an interface board 14 and one or more interconnecting circuit boards 16 and a plurality of insulating boards 18 arranged on a heat sink 19. The interconnecting circuit boards 16 and the insulating boards 18 are alternately interposed between the interface board 14 and the array of electronic components 12 such that an insulating board 18 is positioned adjacent the interface board 14 and adjacent the array of electronic components 12. The interface board 14 provides external electrical connections to the electronic components 12, while the interconnecting and insulating boards 16, 18 provide electrical connections between the interface board 14 and the array of electronic components 12 and between the individual electronic components 12.

The insulating boards 18 make electrical connections between the interconnecting circuit boards 16, and similarly between the interconnecting circuit boards 16 and both the interface board 14 and the electronic components 12, as shown in FIGS. 3 and 4. Each interconnecting circuit board 16 includes contact areas 20 on both surfaces of the board and selected electrical connections between the contact areas 20. Interposed between the interconnecting boards 16 is an insulating board 18 having openings 22 at positions corresponding to the contact areas 20. Electrical connections between the contact areas 20 of the interconnecting boards 16 are established by compressing the interconnecting boards 16 and insulating board 18 together, thus compressing connector elements 24 positioned in the openings 22 of the insulating board 18 against the contact areas 20.

In one of the preferred embodiments of the backplane interconnection system 10 of the present invention, the array of electronic components 12 is oriented in a parallel configuration with respect to the interconnection system, as shown in Figure In the other preferred embodiment, the array is oriented in a perpendicular configuration, as shown in FIG. 2. In the parallel-oriented configuration, the backplane interconnection system 10 makes the selected electrical connections to surface contact areas 26 on the electronic components 12. In the perpendicular-oriented configuration, as shown in FIG. 5, the interconnection system 10 makes the selected electrical connections to edge contact areas 28 on the electronic components 12. In the parallel-oriented configuration, additional interconnecting circuit boards 16 and insulating boards 18 are interposed between the electronic components 12 and the backplane interconnection system 10 to make the electrical connections to the surface contact areas 26. Although the electronic components 12 are illustrated in the drawings as being IC chip packages mounted on multilayer printed circuit boards, any type of electronic component can be interconnected with the backplane of the present invention. Furthermore, the array of electronic components 12 can be arranged in two and three dimensional arrays in addition to the one dimensional arrays shown in the drawings.

Figure 9:
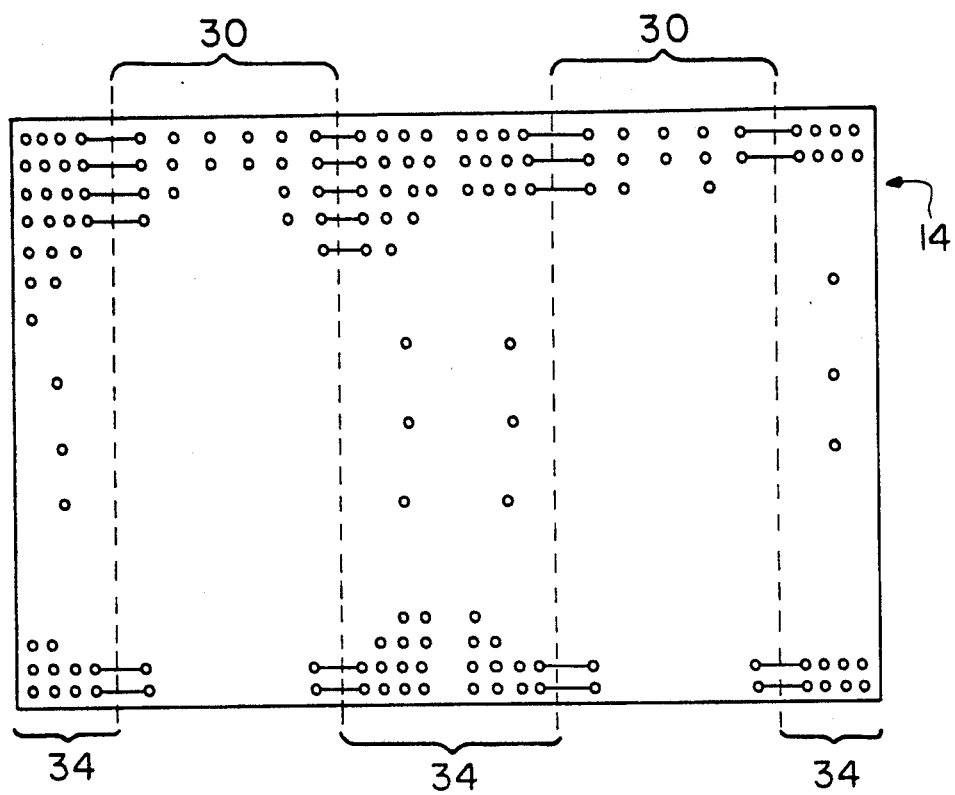
FIG. 9 is a front elevational view of the surface of an interface board used in the backplane interconnection system of the present invention.
Figure 10:
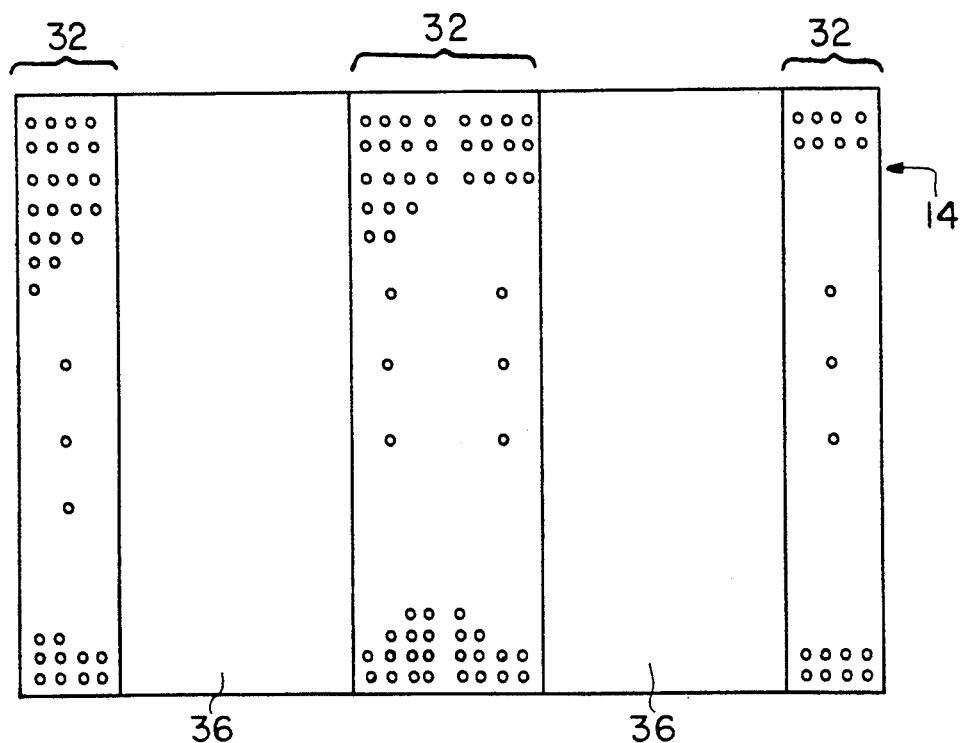
FIG. 10 is a back elevational view of the surface of the interface board used in the backplane interconnection system of the present invention.

As shown in FIG. 9, the interface board 14 includes two columns of contact areas 30 on the front surface of the board for making electrical contact with the connector elements 24 in the adjacent insulating board 18. As shown in FIG. 10, the interface board 14 includes three columns of contact areas 32 on the back surface of the board for making the external electrical connections to the electronic components 12. The contact areas 30 on the front surface of the interface board 14 make selected electrical connections to the contact areas 32 on the back surface of the interface board through three columns of contact areas 34 on the front surface of the interface board 14 that are opposite and electrically connected to the columns of contact areas 32 on the back surface of the board. The back surface of the interface board 14 also includes two ground planes 36 for shielding the contacts 30 on the front surface of the interface board.

The connector elements 24 are each preferably formed from a single strand of metal wire, each strand being wadded together to form a nearly cylindrical "button" of material having a density of between twenty and fifty percent. Each wadded-wire connector element 24 protrudes slightly above and below the insulating board 18 and makes electrical contact at multiple points when compressed against a contact area 20, 26, 28. In addition, each contact made by the wadded-wire connector element 24 is at very high pressure, because of the type of spring formed by the wadded wire and the small area of each contact point.

Connectors of this type have significant advantages over the soldered or wire-wrapped connections used in conventional types of backplane wiring, and provide connections of high integrity and reliability. In contrast to a soldered connection, this mechanical connector element has very few associated variables that can affect the quality of the connection. The only significant variables are the size of the element and the compressive force used to make the connection, both of which can be accurately controlled. In the embodiments described, the wadded-wire connector elements 24 are manufactured by Technical Wire Products, Inc. of Piscataway, N.J., under the the trademark Fuzz Button.

The compression of the wadded-wire connector elements 24 is substantially elastic so that, when the compressive force is removed, the wadded-wire connector elements 24 return to their original shape. This allows the interconnecting circuit boards 16 in the backplane interconnection system 10 to be replaced to easily accommodate any change in the configuration of an electronic component 12. The insulating boards 18, which are commonly referred to as button boards, are preferably formed from an insulating material, such as glass ceramic.

In still another preferred embodiment of the present invention, microstrip transmission lines 38, as shown in FIG. 6A, and strip transmission lines 40, as shown in FIG. 6B, are formed in the backplane interconnection system 10 of the present invention. Microstrip and strip transmission lines provide transmission characteristics similar to those of coaxial cables for signals in the microwave frequency range. A strip transmission line 40 is formed in the interconnection system 10 by two adjacent interconnecting circuit boards 16 having unpatterned conductive metal layers 42 on opposite surfaces and patterned conductive metal layers 44 on adjacent surfaces. A microstrip transmission line 38, which is a miniaturized version of a strip transmission line, is formed in the interconnection system 10 by a single interconnecting circuit board 16 having an unpatterned conductive metal layer 42 on one surface and a patterned conductive metal layer 44 on the other surface. The patterned conductive metal layers 44 form the line conductors of the strip and microstrip transmission lines and the unpatterned conductive metal layers 42 form the ground planes.

As shown in FIG. 7, the strip and microstrip transmission lines 38, 40 are preferably electrically connected to coaxial-shaped contact areas 46 on the surfaces of the parallel-oriented electronic components 12. As shown in FIG. 8, the transmission lines 38, 40 are electrically interconnected with the coaxial-shaped contact areas 46 by coaxial-shaped configurations 48 of contact areas 20 on the interconnecting circuit boards 16 and coaxial-shaped configurations 50 of connector elements 24 in the insulating boards 18. The coaxial-shaped contact area 46 on the electronic component 12 includes a center conductor 52 and an outer annular-shaped ground plane 54. The center conductor 52 makes electrical contact with a center contact area 20 in each coaxial-shaped configuration 48 of contact areas and a center connector element 24 in each coaxial-shaped configuration 50 of connector elements. The outer annular-shaped ground plane 54 makes electrical contact with outer contact areas 20 in each coaxial-shaped configuration 48 of contact areas and outer connector elements 24 in each coaxial-shaped configuration 50 of connector elements.

As shown in FIG. 5, the perpendicular-oriented electronic components 12 are preferably electrically connected to coaxial-shaped contact areas 56 on the edges of the components. The coaxial-shaped contact areas 56 must necessarily be formed from only three edge contact areas 28 because only one column of edge contact areas can usually be accommodated along the edge of a single-layer interconnecting circuit board 16. In each coaxial-shaped contact area 56, the upper and lower edge contact areas form the ground plane and the middle edge contact area forms the center conductor.

From the foregoing, it will be appreciated that the present invention represents a significant advance in the area of backplane wiring. In particular, the present invention minimizes the lead lengths between interconnected electronic components and eliminates the use of conventional cable harnesses and soldered connections. The result is a high speed backplane that can be readily reconfigured for any modification to an electronic component. Although several preferred embodiments of the invention have been shown and described, it will be apparent that other adaptations and modifications can be made without departing from the spirit and scope of the invention. Accordingly, the invention is not to be limited, except as by the following claims.

I claim:

1. A backplane interconnection system, comprising:
    an interface board having contact areas on both surfaces of the interface board and selected connections between the contact areas;
    a plurality of interconnecting circuit boards, each interconnecting circuit board having contact areas on both surfaces of the interconnecting circuit board and selected connections between the contact areas;
    a plurality of insulating boards, the insulating boards and the interconnecting circuit boards being alternately arranged with an insulating board positioned adjacent the interface board, each insulating board having openings at positions corresponding to the contact areas;
    a plurality of conductive connector elements disposed in selected ones of the openings in the insulating boards for making electrical contact between the contact areas; and
    one or more strip transmission lines and one or more microstrip transmission lines formed on one or more of the interconnecting circuit boards;

wherein a compressive force applied to the interface board, the interconnecting circuit boards and the insulating boards forces the connector elements into contact with the contact areas.

2. The backplane interconnection system as set forth in claim 1, wherein each of the connector elements includes a wadded strand of conductive wire that is deformed when compressed between the contact areas and makes multiple electrical contacts between the contact areas.

3. The backplane interconnection system as set forth in claim 2, wherein the insulating boards are fabricated from a glass ceramic.

4. The backplane interconnection system as set forth in claim 2, wherein each wadded strand of wire has a density of approximately 20 to 50 percent.

5. The backplane interconnection system as set forth in claim 1, wherein some of the interconnecting circuit board contact areas and some of the connector elements are formed in coaxial-shaped configurations for electrically interconnecting the strip and microstrip transmission lines.

6. The backplane interconnection system as set forth in claim 5, wherein each of the connector elements includes a wadded strand of conductive wire that is deformed when compressed between the contact areas and makes multiple electrical contacts between the contact areas.

7. The backplane interconnection system as set forth in claim 6, wherein each wadded strand of wire has a density of approximately 20 to 50 percent.

8. The backplane interconnection system as set forth in claim 6, wherein the insulating boards are fabricated from a glass ceramic.

9. A backplane interconnection system, comprising:
an array of electronic components having contact areas;
an interface board having contact areas on both surfaces of the interface board and selected connections between the contact areas;
a plurality of interconnecting circuit boards, each interconnecting circuit board having contact areas on both surfaces of the interconnecting circuit board and selected connections between the contact areas;
a plurality of insulating boards, the insulating boards and the interconnecting circuit boards being alternately interposed between the interface board and the array of electronic components such that an insulating board is positioned adjacent the interface board and adjacent the array of electronic components, each insulating board having openings at positions corresponding to the contact areas;
a plurality of conductive connector elements disposed in selected ones of the openings in the insulating boards for making electrical contact between the contact areas; and
one or more strip transmission lines and one or more microstrip transmission lines formed on one or more of the interconnecting circuit boards;
wherein a compressive force applied to the interface board, the interconnecting circuit boards, the insulating boards and the array of electronic components forces the connector elements into contact with the contact areas.

10. The backplane interconnection system as set forth in claim 9, wherein some of the interconnecting circuit board contact areas and some of the connector elements are formed in coaxial-shaped configurations for electrically interconnecting the strip and microstrip transmission lines with coaxial-shaped contact areas on the array of electronic components.

11. The backplane interconnection system as set forth in claim 10, wherein each of the connector elements includes a wadded strand of conductive wire that is deformed when compressed between the contact areas and makes multiple electrical contacts between the contact areas.

12. The backplane interconnection system as set forth in claim 11, wherein each wadded strand of wire has a density of approximately 20 to 50 percent.

13. The backplane interconnection system as set forth in claim 11, wherein the insulating boards are fabricated from a glass ceramic.

14. The backplane interconnection system as set forth in claim 9, wherein the array of electronic components includes a plurality of IC chip packages that are mounted on multilayer printed circuit boards.

15. The backplane interconnection system as set forth in claim 9, wherein the array of electronic components has a plurality of surface contact areas for making electrical contact with the connector elements in an adjacent insulating board.

16. The backplane interconnection system as set forth in claim 15, wherein the array of electronic components further includes interconnecting circuit boards and insulating boards having connector elements for electrically interconnecting the surface contact areas of the electronic components with the connector elements in an adjacent insulating board.

17. The backplane interconnection system as set forth in claim 16, wherein each of the connector elements includes a wadded strand of conductive wire that is deformed when compressed between the contact areas and makes multiple electrical contacts between the contact areas.

18. The backplane interconnection system as set forth in claim 9, wherein the array of electronic components has a plurality of edge contact areas for making electrical contact with the connector elements in an adjacent insulating board.

19. The backplane interconnection system as set forth in claim 9, wherein each of the connector elements includes a wadded strand of conductive wire that is deformed when compressed between the contact areas and makes multiple electrical contacts between the contact areas.

* * * * *